United States Patent
Lee (10) Patent No.: US 7,446,616 B2
(45) Date of Patent: Nov. 4, 2008

(54) MULTI-PHASE CLOCK GENERATOR AND METHOD THEREOF

(75) Inventor: An-Ming Lee, Hsin-Chu Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 188 days.

(21) Appl. No.: 11/277,039

(22) Filed: Mar. 21, 2006

(65) Prior Publication Data

US 2006/0208811 A1 Sep. 21, 2006

(30) Foreign Application Priority Data

Mar. 21, 2005 (TW) .............................. 94108614 A (51) Int. Cl.
*H03B 27/00* (2006.01)
(52) U.S. Cl. .................. 331/45; 327/237; 327/243; 375/375
(58) Field of Classification Search ............... 331/45; 327/237, 243; 375/375
See application file for complete search history.

(56) References Cited

U.S. PATENT DOCUMENTS

| 6,122,336 | A   | * | 9/2000  | Anderson | 375/371 |
| 6,801,066 | B2  | * | 10/2004 | Lee      | 327/119 |
| 7,135,905 | B2  | * | 11/2006 | Teo et al. | 327/231 |
| 2003/0210758 | A1 |   | 11/2003 | Lee et al. | |

* cited by examiner

*Primary Examiner*—Benny Lee
*Assistant Examiner*—James E Goodley
(74) *Attorney, Agent, or Firm*—Winston Hsu (57) ABSTRACT

A multi-phase clock generator for generating a set of multi-phase clock signals is disclosed. The multi-phase clock generator includes a signal generator, a phase adjusting circuit, and a phase interpolator. The signal generator generates a plurality of first clock signals according to a reference clock signal. The phase adjusting circuit, which is a phase rotator or a phase selecting circuit and coupled to the signal generator receives the first clock signals and adjusts the phases of the first clock signals according to a control signal to generate a plurality of second clock signals. The phase interpolator, which is coupled to the phase adjusting circuit, interpolates the second clock signals to generate the set of multi-phase clock signals.

20 Claims, 6 Drawing Sheets

| D[n-1] | D[n] | D[n+1] | UP | DN |
|---|---|---|---|---|
| 0 | 0 | 0 | 0 | 0 |
| 0 | 0 | 1 | 0 | 1 |
| 0 | 1 | 0 | 0 | 0 |
| 0 | 1 | 1 | 1 | 0 |
| 1 | 0 | 0 | 1 | 0 |
| 1 | 0 | 1 | 0 | 0 |
| 1 | 1 | 0 | 0 | 1 |
| 1 | 1 | 1 | 0 | 0 |

Fig. 6

MULTI-PHASE CLOCK GENERATOR AND METHOD THEREOF

BACKGROUND OF THE INVENTION

1. Field of the Invention

The present invention relates to a data receiving circuit, especially to a multi-phase clock generator and method thereof.

2. Description of the Prior Art

For a large system-on-a-chip (SOC), the manufacturing process is limited primarily by the manufacturing process of the silicon intellectual property (SIP) adopted by the SOC. If the manufacturing process of each SIP were more flexible, the difficulty and time in exploiting an SOC could be reduced. For a common high-speed serial link, data reception and transmission are frequently achieved in the following ways: full-rate reception and transmission, half-rate reception and transmission, or multi-phase over-sampling reception and transmission. The former two methods require a full or a half transmission rate for the operating clock of the chip. When the data transmission rate is as high as or higher than the giga-Hertz (G-bit/sec) level, low-cost manufacturing processes such as 0.25 µm and 0.35 µm processes become deficient and can hardly be utilized. As to the multi-phase over-sampling reception and transmission, plenty of sampling circuits adopting relatively low sampling rates are utilized to achieve high transmission rates. Therefore, the operating clock of the chip can be effectively reduced such that the limit on the manufacturing process can be lowered.

SUMMARY OF THE INVENTION

It is therefore an objective of the present invention to provide a multi-phase clock generator.

According to an embodiment of the claimed invention, a multi-phase clock generator is disclosed. The multi-phase clock generator generates a set of multi-phase clock signals, and the multi-phase clock generator includes a signal generator, a phase adjusting circuit, and a phase interpolator. The signal generator generates a plurality of first clock signals according to a reference clock signal. The phase adjusting circuit, which is a phase rotator or a phase selecting circuit, which are coupled to the signal generator, receives the first clock signals and adjusts the phases of the first clock signals according to a control signal to generate a plurality of second clock signals. The phase interpolator, which is coupled to the phase adjusting circuit, interpolates the second clock signals to generate the set of multi-phase clock signals.

According to another embodiment of the claimed invention, a method for generating a set of multi-phase clock signals is disclosed. The method includes the steps of: generating a plurality of first clock signals according to a reference clock signal; adjusting the phases of the first clock signals according to a control signal to generate a plurality of second clock signals; and interpolating the second clock signals to generate the set of multi-phase clock signals.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
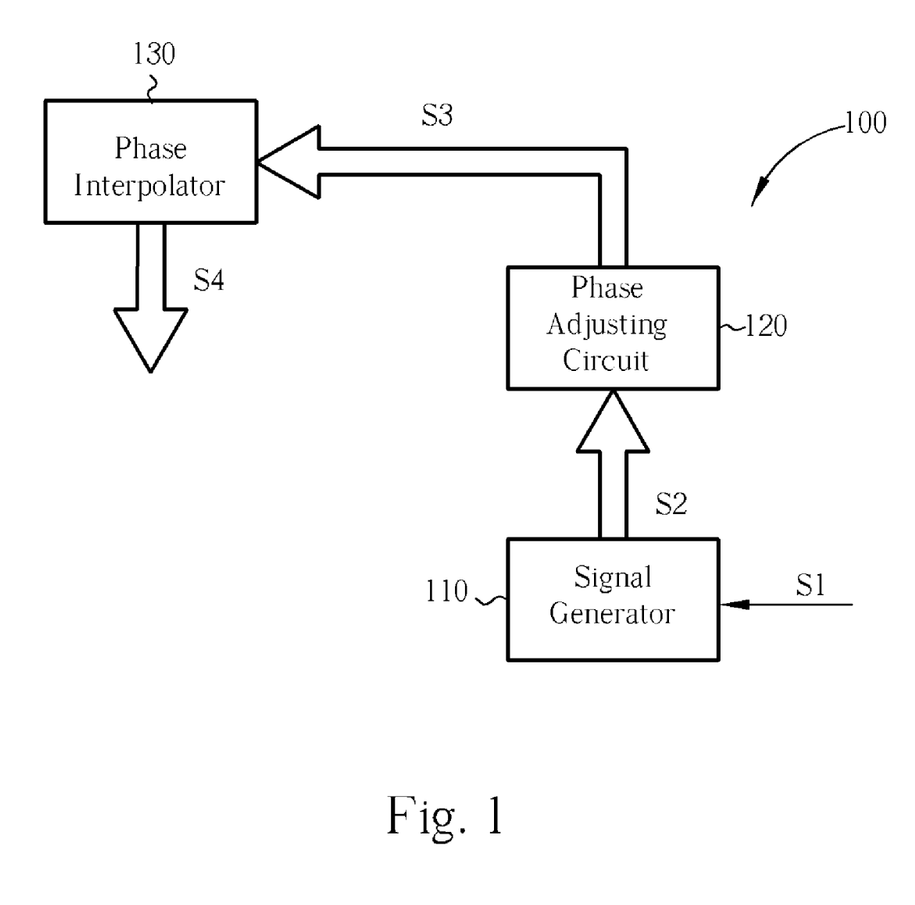
FIG. 1 is a block diagram of a multi-phase clock generator according to a first embodiment of the present invention.

FIG. 1 shows a multi-phase clock generator 100 according to the first embodiment of the present invention. As shown in FIG. 1, the multi-phase clock generator 100 includes a signal generator 110, a phase adjusting circuit 120, and a phase interpolator 130. In this embodiment, the signal generator 110 receives a reference clock signal S1 and generates a plurality of clock signals S2. The clock signals S2 include a plurality of signals that have the same frequency and are each delayed by a specific and constant phase difference. In other words, the result when graphed on a timing diagram forms a ladder or step-like appearance. The phase adjusting circuit 120 can simultaneously shift all of the phases of the clock signals S2 by advancing or delaying the phases by a specific period. The clock signals S2 are phase shifted into the clock signals S3, which also include a plurality of signals. Then the clock signals S3 are transmitted to the phase interpolator 130. The phase interpolator 130 interpolates the clock signals S3 by a specific multiple to generate a set of multi-phase clock signals S4.

Figure 2:
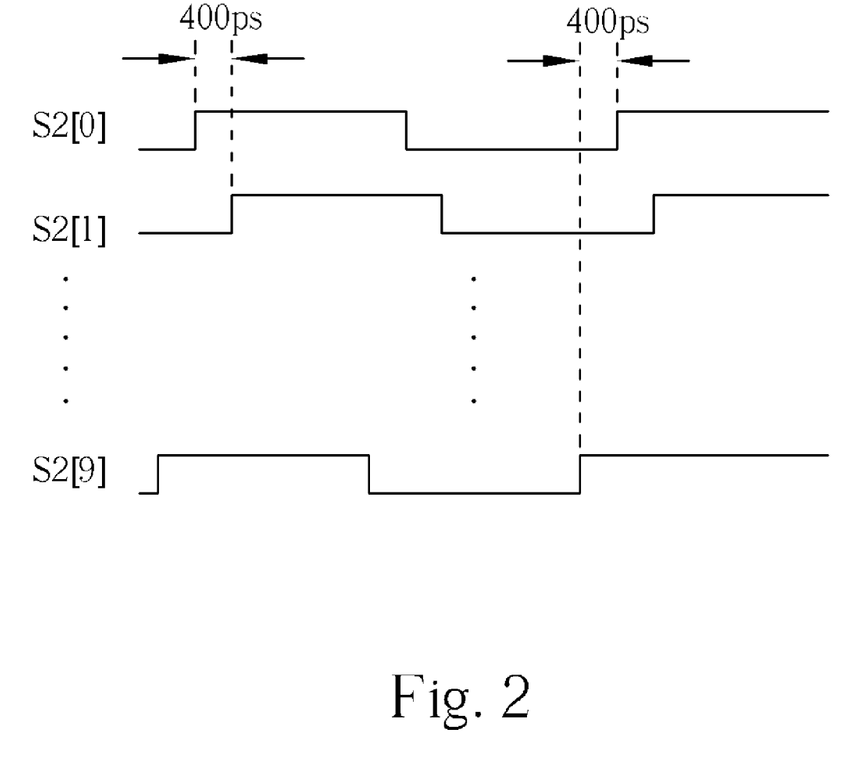
FIG. 2 shows the clock signals generated by the signal generator shown in FIG. 1.
Figure 3:
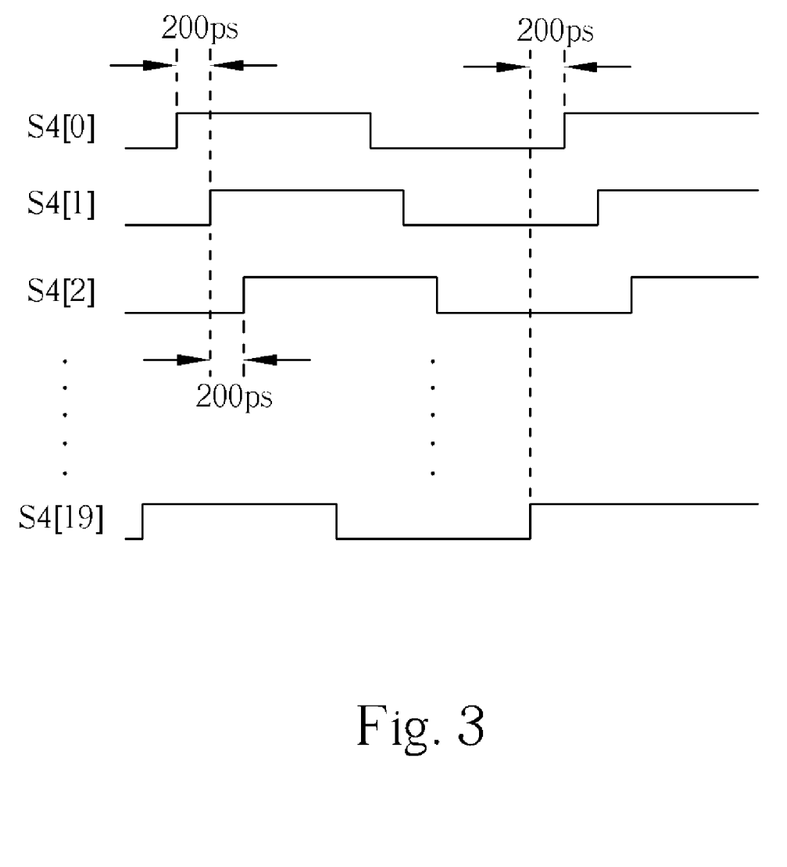
FIG. 3 shows the multi-phase clock signals generated by the phase interpolator shown in FIG. 1.

For example, the signal generator 110 can be a phase locked loop (PLL). The PLL along with a delay circuit and a divider receives a reference clock signal S1 of 100 MHz and then generates 10 clock signals S2 of 250 MHz each of which is delayed by a specific and constant period of 400 ps. Referring to FIG. 2, the clock signals S2 include 10 signals having different phases. The phase adjusting circuit 120 can be a phase selecting circuit or a phase rotator. Practically, the phase adjusting circuit 120 can shift the 10 clock signals S2[0], S2[1], ..., S2[9] by advancing or delaying the phases of the 10 clock signals by a specific period to generate the clock signals S3 which also include 10 signals. In addition, the phase interpolator 130 can interpolate the 10 clock signals S3 with a multiple of 2 to generate 20 multi-phase clock signals S4 of 250 MHz each of which is delayed by a specific and constant period of 200 ps. As shown in FIG. 3, the multi-phase clock signals S4 include 20 signals named S4[0], S4[1], S4[2], ..., S4[19]. The number of the signals, the frequencies, and the phase delays of clock signals S1, S2, S3, and S4 can be optionally adjusted. Because the adjusting method and the operating principles of the phase selecting circuit, the phase rotator, and the phase interpolator are well known by those skilled in the art, the lengthy description is omitted for brevity.

Figure 4:
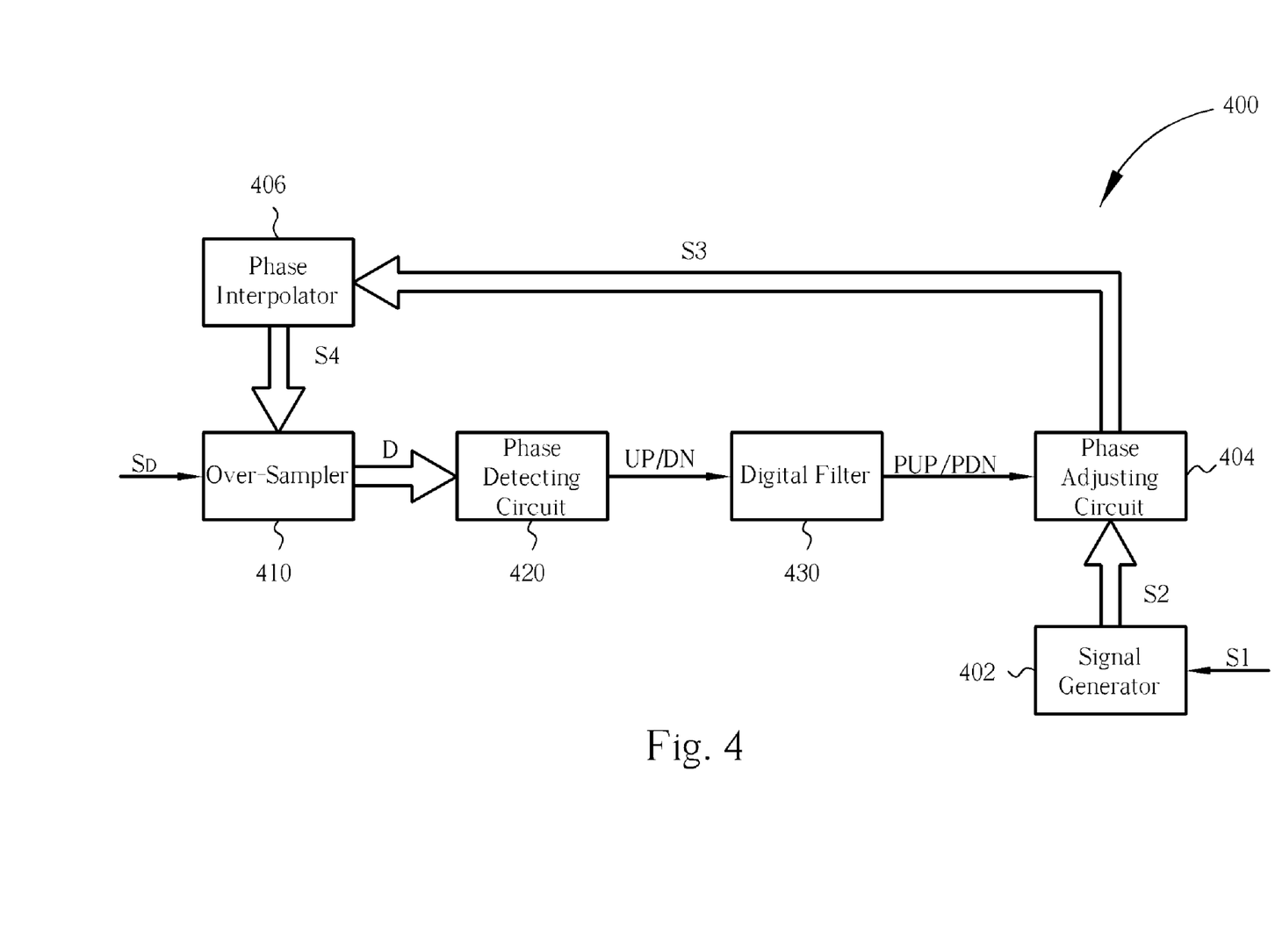
FIG. 4 is a block diagram of a multi-phase clock generator according to a second embodiment of the present invention.

The multi-phase clock generator 100 mentioned above can be utilized for data reception and transmission in a high-speed serial link such as PCI express. Please refer to FIG. 4. FIG. 4 shows a multi-phase clock generator 400 according to the second embodiment of the present invention. The multi-phase clock generator 400 can be applied in a receiving circuit for adjusting the set of multi-phase clock signals S4 according to the receiving status of the receiving circuit. The multi-phase clock generator 400 includes a signal generator 402, a phase adjusting circuit 404, a phase interpolator 406, an over-sampler 410, a phase detecting circuit 420, and a digital filter 430.

The operating principles of the signal generator 402, the phase adjusting circuit 404, and the phase interpolator 406 are the same as those described in the first embodiment so they are not described again for brevity. Please note that in this embodiment the multi-phase clock generator 400 and the receiving circuit share the same over-sampler 410. The over-sampler 410 receives a data signal $S_D$ and then samples the data signal $S_D$ by utilizing the set of multi-phase clock signals S4 as the sampling signal.

In this embodiment, the data signal $S_D$ is over sampled by a sampling signal whose frequency is double of the frequency of the data signal $S_D$, i.e., the frequency of the sampling signal is twice the frequency of the data signal $S_D$. The set of multi-phase clock signals S4 can be regarded as a high frequency signal, therefore, if the frequency of the data signal $S_D$ is 2.5 GHz, then the effective frequency of the set of multi-phase clock signals S4 is supposed to be 5 GHz or more, according to the sampling theorem. For example, the set of multi-phase clock signals S4 may include 20 signals each of which is 250 MHz and delayed by 200 ps as shown in FIG. 3. That is, the set of multi-phase clock signals S4 can be regarded as a signal S4 whose effective frequency is equal to 20*250 MHz (=5 GHz). Therefore, although the frequency of the data signal $S_D$ is as high as 2.5 GHz, the multi-phase clock generator 400 merely needs to generate signals of 250 MHz by utilizing the aforementioned technique. As a result, the manufacturing cost can be greatly reduced.

Figure 5:
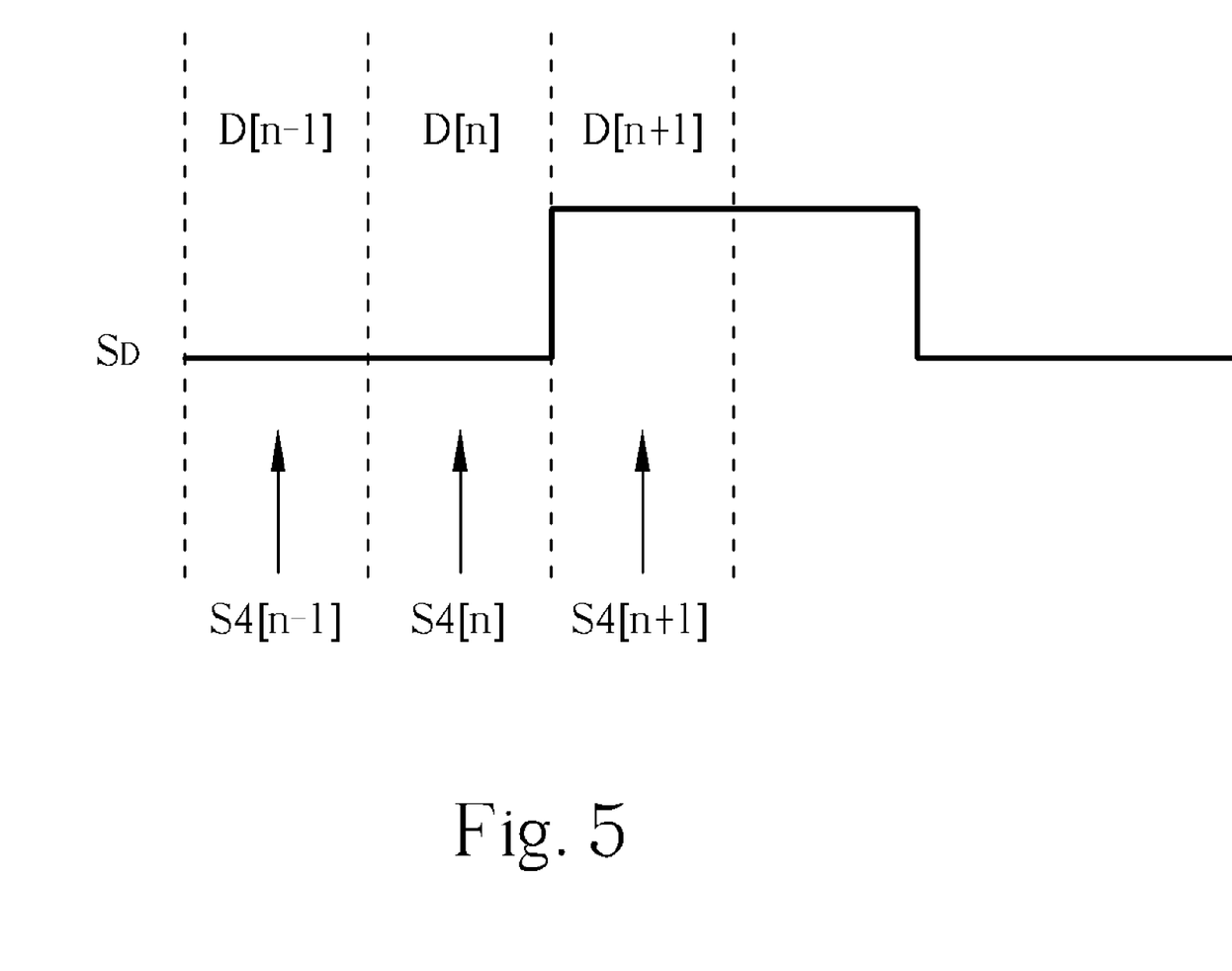
FIG. 5 shows the relation between a data signal and the multi-phase clock signals.

Because the sampling signal, i.e., the set of multi-phase clock signals S4, includes 20 signals, in each sampling process the over sampler 410 generates 20 sampled data D correspondingly. In this embodiment, to achieve better sampling result, the phase detecting circuit 420 collects 20 sampled data of a sampling process ($D_n[0], D_n[1], \ldots, D_n[19]$) along with the last sampled data of the previous sampling process ($D_{n-1}[19]$) to generate a set of sampled result having 21 sampled data, and then analyze the relationship between the set of sampled result and the set of multi-phase clock signals S4. Please refer to FIG. 5. FIG. 5 illustrates the operating principle of the phase detecting circuit 420. In FIG. 5 three successive multi-phase clock signals S4 (S4[n−1], S4[n], S4[n+1]) sample the data signal $S_D$ to obtain three sampled data (D[n−1], D[n], D[n+1]). If the multi-phase clock signal S4[n] matches the rising edge or the falling edge of the data signal $S_D$, then the multi-phase clock signals S4[n−1] and S4[n+1] will correspond to the centers of data bits. As a result, the sampled data D[n−1] and D[n+1] would be more correct.

Figure 6:
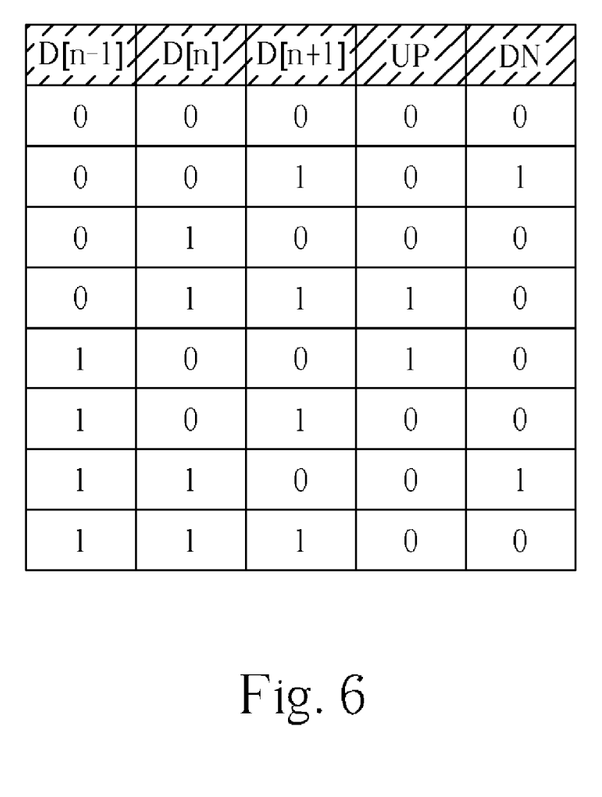
FIG. 6 is the truth table that is utilized by a phase detecting circuit shown in FIG. 4 to generate a phase shifting signal.

As mentioned above, the phase detecting circuit 420 detects a set of sampled results of 21 bits, taking three successive bits as a set to determine the logic values, and generates a signal UP/DN according to the truth table shown in FIG. 6. The signal UP/DN is regarded as determining signal to shift the phases of the set of multi-phase clock signals S4. Referring to FIG. 6, when the phase detecting circuit 420 detects the situations of lines 4 and 5 (011, 100), a signal UP for advancing the phases is generated; alternatively, when the phase detecting circuit 420 detects the situations of lines 2 and 7 (001, 110), a signal DN for delaying the phases is generated. As for the other situations, since information acquired is not sufficient to make a judgment, no signal for advancing or delaying the phases is generated. The signal UP/DN is then transmitted to the digital filter 430 for further processing.

The function of the digital filter 430 is effectively equal to a low pass filter. The present invention provides three methods that the digital filter 430 follows to determine the timing of phase shifting.

Method 1: Running average. The UP signal is regarded as a "1", the DN signal is regarded as a "−1", and the initial value of the digital filter 430 is set to be "0". The digital filter 430 sums the received UP signal and DN signal, and a threshold M is set. When the summed value is larger than M, the digital filter 430 generates a signal PUP for advancing the phases, and the phase adjusting circuit 404 shifts the clock signals S3 by advancing the phases according to the signal PUP. The summed value is then reset to 0. Alternatively, when the summed value is less than−M, the digital filter 430 generates a signal PDN for delaying the phases, and the phase adjusting circuit 404 shifts the clock signals S3 by delaying the phases according to the signal PDN. Then, the summed value is reset to 0.

Method 2: Averaging in an interval. The UP signal is regarded as a "1", the DN signal is regarded as a "−1", and the initial value of the digital filter 430 is set to be "0". The digital filter 430 sums the received UP signal and DN signal, and a time threshold T is set. By summing up the received UP signal and DN signal over the time threshold T, the digital filter 430 generates the signal PUP for advancing the phases or the signal PDN for delaying the phases according to the summed value. If the summed value is larger than "0", the digital filter 430 generates the signal PUP to instruct the phase adjusting circuit 404 to shift the clock signals S3 by advancing the phases, and the summed value is reset to 0. If the summed value is less than "0", the digital filter 430 generates the signal PDN to instruct the phase adjusting circuit 404 to shift the clock signals S3 by delaying the phases, and the summed value is reset to 0.

Method 3: Accounting separately. The UP signal and the DN signal are both regarded as a "1", and the initial value of the digital filter 430 is set to be "0". The received UP signal and DN signal are summed up respectively, and a threshold M is set. When the summed value corresponding to the UP signal is larger than M, the digital filter 430 generates the signal PUP to instruct the phase adjusting circuit 404 to shift the clock signals S3 by advancing the phases, and the summed value corresponding to the UP signal is reset to 0. Alternatively, when the summed value corresponding to the DN signal is larger than M, the digital filter 430 generates the signal PDN to instruct the phase adjusting circuit 404 to shift the clock signals S3 by delaying the phases, and the summed value corresponding to the DN signal is reset to 0.

In this embodiment, because the 10 clock signals S2 (250 MHz) required by the phase adjusting circuit 404 are generated by the signal generator 402, and each of the 10 clock signals S2 is delayed by 400 ps, after being processed by the phase adjusting circuit 404, the phases of the 10 clock signals S3 are advanced or delayed for a specific period. Therefore, the clock signals S3 whose phases are adjusted can be utilized as the sampling signal to obtain more accurate sampling results.

Please note that the number of clock signals S2 is not constrained to 10. Basically, it is only required that the effective frequency A*B*C, is larger than the frequency of the data signal $S_D$, where A is the number of the clock signals outputted by the phase adjusting circuit 404, B is the frequency of the clock signals, and C is the multiple utilized by the phase interpolator 406. For example, if the effective frequency (A*B*C) is twice the frequency of the data signal $S_D$, and the frequency of the data signal $S_D$ is 2.5 Gb/sec, these are the several choices for the clock signals S2 and the multiple of the phase interpolator 406:

1. 10 clock signals of 250 MHz each of which is delayed by 400 ps, and the multiple is 2. Therefore, a sampling signal including 20 clock signals with 250 MHz each of which is delayed by 200 ps is obtained. The effective frequency is 250 MHz*10*2 (=5 GHz).

2. 5 clock signals of 250 MHz each of which is delayed by 800 ps, and the multiple is 4. Therefore, a sampling signal including 20 clock signals with 250 MHz each of which is delayed by 200 ps is obtained. The effective frequency is 250 MHz*5*4 (=5 GHz).

3. 5 clock signals of 500 MHz each of which is delayed by 400 ps, and the multiple is 2. Therefore, a sampling signal including 10 clock signals with 500 MHz each of which is delayed by 200 ps is obtained. The effective frequency is 500 MHz*5*2 (=5 GHz).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-phase clock generator for generating a set of multi-phase clock signals, the multi-phase clock generator comprising:
    a signal generator for generating a plurality of first clock signals according to a reference clock signal;
    a phase adjusting circuit which is a phase rotator or a phase selecting circuit, the phase adjusting circuit being coupled to the signal generator for receiving the first clock signals and adjusting the phases of the first clock signals according to a control signal to generate a plurality of second clock signals; and
    a phase interpolator coupled to the phase adjusting circuit for interpolating the second clock signals to generate the set of multi-phase clock signals;
    wherein the multi-phase clock signals are greater in number than the second clock signals.

2. The multi-phase clock generator of claim 1, further comprising:
    an over-sampler coupled to the phase interpolator for receiving a data signal and sampling the data signal according to the set of multi-phase clock signals to generate a sampled data;
    a phase detecting circuit coupled to the over-sampler for detecting the sampled data to generate at least a detecting result; and
    a digital filter coupled to the phase detecting circuit and the phase adjusting circuit for generating the control signal according to the detecting result.

3. The multi-phase clock generator of claim 2, wherein the digital filter sums the detecting result to generate a summed value and when the summed value reaches a threshold, the digital filter generates the control signal and the summed value resets.

4. The multi-phase clock generator of claim 2, wherein the digital filter sums the detecting result in a predetermined period to generate a summed value, and then the digital filter generates the control signal according to the summed value and the summed value resets.

5. The multi-phase clock generator of claim 4, wherein when the summed value is larger than a threshold, the phase adjusting circuit shifts the second clock signals by advancing the phases of the second clock signals according to the control signal, and when the summed value is not larger than the threshold, the phase adjusting circuit shifts the second clock signals by delaying the phases of the second clock signals according to the control signal.

6. The multi-phase clock generator of claim 2, wherein the product of the number of the multi-phase clock signals and the frequency of the multi-phase clock signals is larger than the frequency of the data signal.

7. The multi-phase clock generator of claim 2, wherein the phase detecting circuit generates the detecting result according to a plurality of sampled values of the sampled data.

8. A method for generating a set of multi-phase clock signals, comprising the steps of:
    generating a plurality of first clock signals according to a reference clock signal;
    adjusting the phases of the first clock signals according to a control signal to generate a plurality of second clock signals; and
    interpolating the second clock signals to generate the set of multi-phase clock signals;
    wherein the multi-phase clock signals are greater in number than the second clock signals.

9. The method of claim 8, further comprising:
    receiving a data signal and sampling the data signal according to the set of multi-phase clock signals to generate a sampled data;
    detecting the sampled data to generate at least a detecting result; and
    generating the control signal according to the detecting result.

10. The method of claim 9, wherein the step of generating the control signal is summing the detecting result to generate a summed value and when the summed value reaches a threshold, generating the control signal and resetting the summed value.

11. The method of claim 9, wherein the step of generating the control signal is summing the detecting result in a predetermined period to generate a summed value, and generating the control signal according to the summed value and resetting the summed value.

12. The method of claim 11, wherein when the summed value is larger than a threshold, shifting the second clock signals by advancing the phases of the second clock signals according to the control signal, and when the summed value is not larger than the threshold, shifting the second clock signals by delaying the phases of the second clock signals according to the control signal.

13. The method of claim 9, wherein the product of the number of the multi-phase clock signals and the frequency of the multi-phase clocks is larger than the frequency of the data signal.

14. The method of claim 9, wherein the step of generating the detecting result is accomplished according to a plurality of sampled values of the sampled data.

15. A multi-phase clock generator for generating a set of multi-phase clock signals, the multi-phase clock generator comprising:
    a signal generator for generating a plurality of first clock signals according to a reference clock signal;
    a phase adjusting circuit which is a phase rotator or a phase selecting circuit, the phase adjusting circuit being coupled to the signal generator for receiving the first clock signals and adjusting the phases of the first clock signals according to a control signal to generate a plurality of second clock signals;
    a phase interpolator coupled to the phase adjusting circuit for interpolating the second clock signals to generate the set of multi-phase clock signals;
    an over-sampler coupled to the phase interpolator for receiving a data signal and sampling the data signal according to the set of multi-phase clock signals to generate a sampled data;
    a phase detecting circuit coupled to the over-sampler for detecting the sampled data to generate at least a detecting result; and a digital filter coupled to the phase detecting circuit and the phase adjusting circuit for generating the control signal according to the detecting result;

wherein the digital filter sums the detecting result to generate a summed value and when the summed value reaches a threshold, the digital filter generates the control signal and the summed value resets;

wherein when the summed value reaches a first threshold, the phase adjusting circuit shifts the second clock signals by advancing the phases of the second clock signals according to the control signal, and when the summed value reaches a second threshold, the phase adjusting circuit shifts the second clock signals by delaying the phases of the second clock signals according to the control signal.

16. A multi-phase clock generator for generating a set of multi-phase clock signals, the multi-phase clock generator comprising:

a signal generator for generating a plurality of first clock signals according to a reference clock signal;

a phase adjusting circuit which is a phase rotator or a phase selecting circuit, the phase adjusting circuit being coupled to the signal generator for receiving the first clock signals and adjusting the phases of the first clock signals according to a control signal to generate a plurality of second clock signals;

a phase interpolator coupled to the phase adjusting circuit for interpolating the second clock signals to generate the set of multi-phase clock signals;

an over-sampler coupled to the phase interpolator for receiving a data signal and sampling the data signal according to the set of multi-phase clock signals to generate a sampled data;

a phase detecting circuit coupled to the over-sampler for detecting the sampled data to generate at least a detecting result; and a digital filter coupled to the phase detecting circuit and the phase adjusting circuit for generating the control signal according to the detecting result;

wherein the digital filter generates a first summed value according to the detecting result corresponding to a first logic value, and generates a second summed value according to the detecting result corresponding to a second logic value, and when the first summed value reaches a first threshold, the digital filter generates the control signal and the first summed value resets, and when the second summed value reaches a second threshold, the digital filter generates the control signal and the second summed value resets.

17. The multi-phase clock generator of claim 16, wherein when the first summed value reaches the first threshold, the phase adjusting circuit shifts the second clock signals by advancing the phases of the second clock signals according to the control signal, and when the second summed value reaches the second threshold, the phase adjusting circuit shifts the second clock signals by delaying the phases of the second clock signals according to the control signal.

18. A method for generating a set of multi-phase clock signals, comprising the steps of:

generating a plurality of first clock signals according to a reference clock signal;

adjusting the phases of the first clock signals according to a control signal to generate a plurality of second clock signals;

interpolating the second clock signals to generate the set of multi-phase clock signals;

receiving a data signal and sampling the data signal according to the set of multi-phase clock signals to generate a sampled data;

detecting the sampled data to generate at least a detecting result; and generating the control signal according to the detecting result;

wherein the step of generating the control signal is summing the detecting result to generate a summed value and when the summed value reaches a threshold, generating the control signal and resetting the summed value;

wherein when the summed value reaches a first threshold, shifting the second clock signals by advancing the phases of the second clock signals according to the control signal, and when the summed value reaches a second threshold, shifting the second clock signals by delaying the phases of the second clock signals according to the control signal.

19. A method for generating a set of multi-phase clock signals, comprising the steps of:

generating a plurality of first clock signals according to a reference clock signal;

adjusting the phases of the first clock signals according to a control signal to generate a plurality of second clock signals;

interpolating the second clock signals to generate the set of multi-phase clock signals;

receiving a data signal and sampling the data signal according to the set of multi-phase clock signals to generate a sampled data;

detecting the sampled data to generate at least a detecting result; and generating the control signal according to the detecting result;

wherein the step of generating the control signal is generating a first summed value according to the detecting result corresponding to a first logic value, and generating a second summed value according to the detecting result corresponding to a second logic value, and when the first summed value reaches a first threshold, generating the control signal and resetting the first summed value, and when the second summed value reaches a second threshold, generating the control signal and resetting the second summed value.

20. The method of claim 19, wherein when the first summed value reaches the first threshold, shifting the second clock signals by advancing the phases of the second clock signals according to the control signal, and when the second summed value reaches the second threshold, shifting the second clock signals by delaying the phases of the second clock signals according to the control signal.

* * * * *